(12) United States Patent
Lifka et al.

(10) Patent No.: US 7,710,032 B2
(45) Date of Patent: May 4, 2010

(54) ENCAPSULATION STRUCTURE FOR DISPLAY DEVICES

(75) Inventors: Herbert Lifka, Eindhoven (NL); Jeroen Henri Antoine Maria Van Buul, Heerlen (NL); Paulus Cornelis Duineveld, Drachten (NL); Gerardus Henricus Riet Jens, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 942 days.

(21) Appl. No.: 10/563,931

(22) PCT Filed: Jul. 9, 2004

(86) PCT No.: PCT/IB2004/051182

§ 371 (c)(1),
(2), (4) Date: Jan. 9, 2006

(87) PCT Pub. No.: WO2005/006441

PCT Pub. Date: Jan. 20, 2005

(65) Prior Publication Data

US 2006/0159862 A1    Jul. 20, 2006

(30) Foreign Application Priority Data

Jul. 11, 2003   (EP) .................................. 03102120

(51) Int. Cl.
*H05B 33/00* (2006.01)
*H01J 1/62* (2006.01)

(52) U.S. Cl. ........................................ 313/512; 445/23

(58) Field of Classification Search ......... 313/504–506, 313/512; 445/23–25
See application file for complete search history.

(56) References Cited

U.S. PATENT DOCUMENTS

| | | | |
|---|---|---|---|
| 5,410,644 | A | 4/1995 | Thier et al. |
| 6,275,253 | B1 | 8/2001 | Melen |
| 6,356,297 | B1 | 3/2002 | Cheng et al. |
| 6,413,645 | B1 | 7/2002 | Graff et al. |
| 6,504,569 | B1 | 1/2003 | Jasinschi et al. |
| 6,573,652 | B1 | 6/2003 | Graff et al. |
| 2001/0045979 | A1 | 11/2001 | Matsumoto et al. |
| 2002/0118275 | A1 | 8/2002 | Harman |
| 2002/0125822 | A1 | 9/2002 | Graff et al. |
| 2003/0003225 | A1 | 1/2003 | Choi et al. |
| 2003/0117066 | A1 | 6/2003 | Silvernail |

FOREIGN PATENT DOCUMENTS

| | | |
|---|---|---|
| DE | 19603746 A1 | 4/1997 |
| EP | 0822586 A2 | 2/1998 |
| EP | 1089573 A2 | 4/2001 |
| EP | 1278244 A2 | 1/2003 |
| GB | 2337390 A | 11/1999 |
| GB | 2352901 A | 2/2001 |
| WO | 0027131 A2 | 5/2000 |
| WO | 0152528 A1 | 7/2001 |

*Primary Examiner*—Joseph L Williams
(74) *Attorney, Agent, or Firm*—Thorne & Halajian, LLP

(57) ABSTRACT

An encapsulation structure for a display device includes a sealing structure and a stabilization layer. The sealing structure is an essentially water/oxygen impermeable film which covers environmentally sensitive parts and protrusions on the display device. The stabilization layer covers the display device, protrusions on the display and the sealing structure with a scratch resistant protective layer, resulting in a water/oxygen impermeable and scratch resistant encapsulation structure.

25 Claims, 1 Drawing Sheet

ENCAPSULATION STRUCTURE FOR DISPLAY DEVICES

FIELD OF THE INVENTION

The present invention relates to encapsulation structures for display devices, methods for producing such structures, as well as to display devices comprising such encapsulation structures.

BACKGROUND OF THE INVENTION

Display devices are known in graphic display and imaging art. Examples of such devices are liquid crystal displays (LCD) and electroluminiscent devices, such as LED (light emitting diode) based devices, organic light emitting diode (OLED) devices and polymer light emitting diode (polyLED) devices.

An electroluminiscent device is a device comprising electroluminiscent material capable of emitting light when a current is passed through it, the current being supplied by means of electrodes. Electroluminiscent devices of the diode type preferentially pass current in one direction and generally comprise electroluminiscent material disposed between an anode and a cathode.

Display devices are often sensitive to oxygen and moisture etc and, consequently, may degrade when exposed to the atmosphere. Exposure to oxygen and/or moisture, particularly in the presence of light, may lead to photo-oxidative degradation of a polymer material used.

Furthermore, oxidation at the cathode/polymer interface is one of the first problems arising in connection to oxygen and/or moisture diffusion in devices such as OLEDs or polyLEDs. Such reactions will significantly reduce the performance of the light emitting properties of the device.

Moreover, other materials used in the display device may also degrade when exposed to the atmosphere. Therefore, there is a need for sealing the device.

Efforts have been made by evaporating metal films to seal display devices. However, these films often contain pinholes. Therefore, these films need to be relatively thick, which results in poor light transmission. Many of the known processes for achieving a more or less proof encapsulation of the devices require temperatures above 300° C. during the sealing process. Most polymer-based devices are not compatible with such high temperatures.

Furthermore, display devices, and in particular the actual diode structures of a polyLED/OLED display, are sensitive to mechanical forces applied to the devices. Scratching the surface of a sealed display device could lead to the breaking of the surface. The surface at structures in the device, such as negative resists and other protrusions, are especially sensitive. Breaking of the surface would affect the display in the sense of loss of function in parts of the display device. It would also mean that a physical hole appear in the sealing of the surface, through which moisture and oxygen can permeate and reduce the lifetime of the device. Thus there is a need for encapsulation of the sealed device.

U.S. Pat. No. 6,413,645 discloses a barrier assembly comprising a barrier layer and a polymer layer formed on top of the barrier layer. The assembly may be applied on top of a display device with low temperature methods, thus covering and protecting the device from water and oxygen. The barrier assembly consists of at least one layer of a barrier material, such as metal oxides, metal nitrides and metal carbides etc, that acts as water/oxygen barriers. The polymer layer has no intrinsic barrier function, but works as a planarisation layer.

However, the barrier assembly disclosed in U.S. Pat. No. 6,413,645 is vulnerable to mechanical forces. If a mechanical force is applied to the device, the barrier assembly would be damaged, and the water/oxygen permeability would be drastically impaired. In order to strengthen the assembly, the deposition of additional layers, such as protective polymer layers and scratch resistant layers, on the barrier assembly is proposed. However, these extra layers introduces additional steps into the manufacturing method, which thus becomes complicated and expensive, and the total barrier assembly with the extra protective layers becomes relatively thick.

SUMMARY OF INVENTION

An object of the present invention is to provide an encapsulation structure, which overcomes the above-described problems with the prior art.

This and other objects are achieved by an encapsulation structure for a display device, comprising a dielectric sealing structure and a stabilisation layer. The dielectric sealing structure forms an essentially water/oxygen impermeable film on the device. The stabilisation layer is formed on the sealing structure and is intended to stabilise and protect the sealing structure, as well as to provide a scratch resistant surface on the display device.

In one embodiment, the sealing structure comprises at least two layers of dielectric material. By using at least two layers, a pinhole free structure is obtained. The sealing structure may be transparent and may comprise a third layer of a dielectric material formed on the top on the second layer.

In accordance with one embodiment of the invention, the first and the third layer of the sealing structure are made of the same dielectric material. However, the first and the third layer may also be made of different dielectric materials.

The dielectric material in the second layer is selected form the group comprising silicon oxide, silicon oxynitride, silicon oxide fluoride, titanium oxide, tantalum oxide, zirconium oxide, hafnium oxide, aluminium oxide, or any mixture thereof.

The stabilisation layer is thick enough to cover protruding structures in the sealing structure, so that said protruding structures are encapsulated in the material forming the stabilisation layer and covered under the essentially flat surface of said stabilisation layer. The stabilisation layer according to the present invention may comprise a cured (or otherwise hardened), e.g. thermally cured, material. Said material may be a polymeric or non-polymeric organic or inorganic material which may be transparent.

In accordance with one embodiment of the invention, the stabilisation layer is deposited on the device by inkjet printing. The stabilisation layer is hardened or cured subsequent of the deposition.

The display device may be a polyLED (polymer light emitting diode) or an OLED (organic light emitting diode) based display comprising protruding structures with negative slopes, such as negative resists.

The present invention also relates to a method for the manufacture of an encapsulation structure for a display device, comprising depositing a sealing structure on the device and depositing a stabilisation layer on top of the sealing structure.

The present invention also relates to a display device comprising an encapsulation structure in accordance with the invention.

These and other aspects of the invention will be apparent from and elucidated with reference to the embodiments described hereinafter.

BRIEF DESCRIPTION OF THE DRAWING

The present invention will now be further described with reference to the accompanying drawing in which.

DESCRIPTION OF PREFERRED EMBODIMENTS

Figure 1:
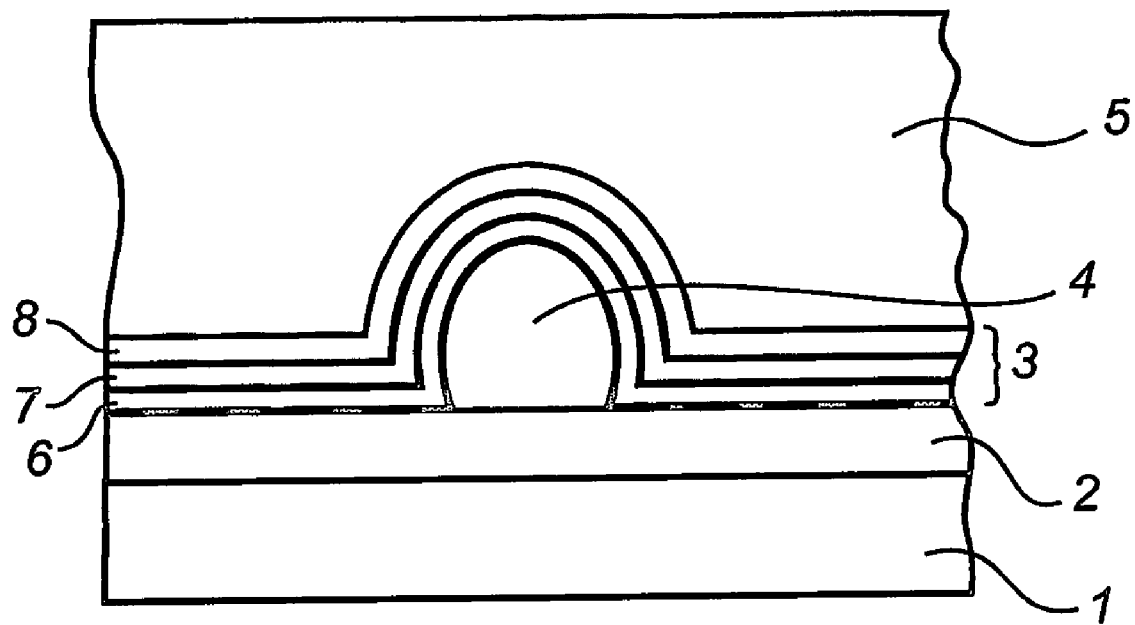
FIG. 1 shows a schematic cross sectional view of one embodiment of a display device protected by an encapsulation structure in accordance with the present invention.

The present invention relates to an encapsulation structure for a display device, comprising a sealing structure 3 and a stabilisation layer 5. In a preferred embodiment of the invention, the sealing structure 3 comprises a first layer 6 of a first dielectric material and a second layer 7 of a second dielectric material. In one embodiment of the invention, said sealing structure 3 also comprises a third layer 8 of a third dielectric material. Said third dielectric material may be of the same material as said first dielectric layer.

FIG. 1 illustrates an embodiment of a polyLED display device arranged on a substrate 1. The device further comprises a polymer light emitting diode (polyLED) 2, and protrusions 4. The display device is sealed with a sealing structure 3, comprising three layers of dielectric materials 6, 7, 8, and finally a stabilisation layer 5 which encapsulates the display device and stabilises the structures on the display device.

The substrate 1 may be a soda-lime or boron-silicate glass. However, other more or less oxygen and/or moisture permeable substrates may be used, such as metals, plastic and/or flexible substrates. Moreover, the substrate may be transparent or opaque. The substrate may also contain active components e.g. thin film transistors and/or passive components e.g. diodes and capacitors. The polyLED 2 may be formed on the substrate using suitable manufacturing methods known by the man skilled in the art.

The sealing structure 3, which function as a diffusion barrier to oxygen and/or moisture, is formed on the display device, and hence a much longer durability of the display device is achieved. The term "sealing structure" as used herein, refers to an essentially water and/or oxygen impermeable structure, preferably a thin film comprising one or more layers that provides a barrier against water and/or oxygen. The sealing structure is deposited on the display device to protect the same from water and/or oxygen which otherwise would impair the performance of the display device.

In one embodiment of the present invention, the sealing structure 3 comprises three layers 6, 7, 8 of dielectric materials, and may be transparent. The first layer 6 of the sealing structure may be of low pinhole density, and may cover substantially the entire surface of cathode material. The first layer of dielectric material is formed after the deposition of the cathode material without exposing the display device to air, i.e. keeping the device in an inert atmosphere. The subsequent layers of dielectric material may be formed using the same technique as for the first dielectric layer.

The first layer 6 may comprise silicon nitride, which closes most of the area of the display device, and only leaves a few pinholes open. However, these pinholes would not be closed by making the silicon nitride layer thicker, since the chemical surface of the pinholes prevents sticking of the nitride. By depositing a second layer 7, e.g. an oxide, the surface of the first layer is modified, and the oxide layer will cover the pinholes.

However, the oxide layer does not provide a significant diffusion barrier to oxygen/moisture as silicon nitride does, and therefore a third layer 8, e.g. comprising a material suitable for use as said first layer, is deposited on top of the second layer. The third layer sticks to the oxide layer, and thus an intact surface without pinholes and with good barrier properties is achieved.

The sealing structure 3 may comprise a N—O—N or O—N—O structure, where "N" means a dielectric nitride-layer, e.g. a layer of silicon nitride or aluminium nitride, and where "O" means a dielectric oxide layer, selected from a layer of silicon oxide, silicon oxide fluoride, titanium oxide, tantalum oxide, zirconium oxide, hafnium oxide, aluminium oxide or any mixture thereof. Among these, silicon oxide has shown surprisingly good results.

For the formation of the layers comprised in the sealing structure, a low temperature plasma enhanced chemical vapour deposition (PECVD) method may be used. However, other techniques known by the man skilled in the art may be used depending on the materials used.

The sealing structure of the present embodiment comprises about 200 nm of silicon nitride, about 300 nm of silicon oxide and again about 200 nm of silicon nitride, deposited at 80° C. Examples of the N—O—N sealing structure according to the present invention have been shown to have a water permeation rate of as low as $1*10^{-6}$ g/m$^2$/day, which may be additionally improved by increasing the thickness of the materials or by adding extra layers, for example forming a N—O—N—O—N, O—N—O—N—O, N—O—N—O—N—O—N or a O—N—O—N—O—N—O sealing structure.

In another embodiment of the invention, the sealing structure also comprises a gettering layer formed as a additional layer included in the sealing structure. This gettering layer functions as a built in moisture trap for moisture sensitive devices. Examples of suitable materials for the gettering layers are BaO and CaO.

The sealing structure may also comprise an organic polymer layer inbetween two layers of dielectric material. Other sealing structures demonstrating a satisfactory water/oxygen impermeability may also be used, alone or in combination with the above mentioned sealing structure. Such other sealing structures may for example comprise metallic layers, ceramic layers, combinations of these materials alone or with other layers.

The stabilisation layer 5 may be formed of a curable or otherwise hardenable composition, deposited in its liquid phase and cured subsequent of the deposition to form a scratch resistant, preferably transparent, solid or amorphous surface. The material for the stabilisation layer may be an UV or thermally curable polymeric or non-polymeric material. It could also be a low temperature melting metallic compound, such as Indium.

By a non-polymeric material is meant a material without a carbon based backbone, e.g. a silicon based material. Non-limiting examples of polymeric materials comprises epoxy based and acrylate based materials, and non-limiting examples of non-polymeric materials comprises silica gel based materials and 3-glycidooxypropyltrimethoxysilane.

In one embodiment of the invention, the stabilisation layer 5 is formed from a thermally cured inorganic composition. Examples of well working materials are found in the following exemplifying examples. The material and the corresponding curing method is preferably carefully chosen to be compatible with the sealing structure 3 and the display device. For example, polyLED and OLED displays with transparent cathodes are often sensitive to UV-radiation since the electroluminiscent polyLED and OLED materials are very sensitive to UV-radiation. In these cases it is often suitable to choose a thermally curable material for the stabilisation layer.

One advantage with the deposition of a hard, scratch resistant stabilising layer on the display device is that extra protective cover plates, as used in prior art, is no longer crucial. This provides possibilities to produce thinner and lighter, but still durable, display devices.

The stabilisation layer 5 is deposited on the sealing structure 3, and is preferably thick enough to cover protruding structures 4, such as negative resists and particles that were located on the display device before the deposition of the sealing structure. Any dust particles on the device before the depositing of the sealing structure may, because of the thinness of the sealing structure, cause unexpected protrusions in the sealing structure. These protrusions are water/oxygen impermeable but may introduce mechanical instability. Any mechanical force applied on them, might cause them to break the surface, thereby opening a hole in the sealing structure, through with water and oxygen can permeate.

The thickness of the stabilisation layer 5 implies that such protrusions will be effectively encapsulated, and the mechanical rigidity of the layer stabilises the protrusions, making the display device much less sensitive to mechanical influence.

The stabilisation layer 5 may be thick enough to cover at least some protruding structures 4 of the display device. In some cases protrusions caused by particles on the display device, and other protrusions of similar size, are covered under the essentially planar surface of the stabilisation layer. Larger structures, with sizes at least as the negative resists, may still cause protrusions in the stabilisation layer.

In other cases, essentially all structures on the surface of the display device are covered under an essentially planar surface formed by the stabilisation layer. The stabilisation layer preferably forms an essentially planar surface on top of said protruding structures, and functions as a scratch protection layer that protects underlying structures to break the surface under influence of an external mechanical force. The thickness of the stabilisation layer, measured from a point on the surface of the sealing structure where no protrusion are located, is at least 0.1 µm, and may in some cases be up to 100 µm thick. The optimal thickness is different for different types of display devices with different structures on the surface.

For display devices which do not have said protruding structures, e.g. some active matrix displays, where there are no negative resists, the stabilisation layer is still required to stabilise enclosed particles. In that case the stabilisation layer should be at least 0.1 µm.

By the expression "negative resist" is meant a protruding section, the slope of which creates a shadow region. The negative resist may under some circumstances include a section having perpendicular side walls. In a polyLED display device, the negative resist has a function of patterning the upper electrode layer, i.e. the cathode, by providing a shadow region in which electrode material is not deposited when depositing the upper electrode layer. The negative resists are preferably made of an insulating material, and suitable materials include polymer-based photoresists, $SiO_2$, $Si_3N_4$ $Al_2O_3$. The breadth of the negative resists are e.g. in the range of 1 to 50 µm and the height of the negative resists are e.g. in the range of 0.3 to 10 µm.

The stabilisation layer also fills up the structures of the display device, forming an essentially cavity-free tight fitting encapsulation, forming an essentially cavity-free interface between the stabilisation layer and the display device and its sealing structure respectively. Cavities or bubbles in the stabilisation layer or in the interface between the stabilisation layer and the display device may impair, not only the strength of the encapsulation, but also the optical properties of the display, in particular for so called top emissive displays, where the encapsulation structure faces the potential user. By "essentially cavity-free" is meant that there are no or very few cavities or bubbles in the material.

Further, the material in the stabilisation layer and the encapsulated sealing structure preferably have matching thermal expansion coefficients. With "matching" means that the differences in thermal expansion of the materials at the temperatures that the device is subjected to, does not cause any parts of the display device to break the surface.

The stabilisation layer may be opaque or transparent, depending on the type of display device. For top emissive displays, where the stabilisation layer faces the potential user, at least 70% transparency in the visible wavelengths are preferred. For down emitting displays, where the stabilisation layer is facing away from the potential user, transparency is not important.

The stabilisation layer may be deposited on the display device by several different methods. Such methods include, but are not limited to, spin coating with photolithography defining the structure, spray coating with a shadow mask, flexographic printing, micro-contact printing, screen printing, and inkjet printing.

In one embodiment of the invention, the stabilisation layer is deposited on the display device by inkjet printing of the material for the stabilisation layer in its liquid state. Compared to many of the other possible methods, the inkjet method provides low material consumption and good tolerance and quality (e.g. no bubbles) in the printing. Furthermore, no contact between the printing head and the display device is needed, which otherwise may damage the sealing structure. An example of the parameters for inkjet printing and subsequent processing for the manufacturing of the stabilisation layer is disclosed in the following examples.

The display device on which an encapsulation structure in accordance with the present invention is deposited may be a liquid crystal display, or a light emitting diode based display, e.g. a polyLED (polymer light emitting diode) or a OLED (organic light emitting diode) based display. The display device may be an active or passive polyLED/OLED display comprising protrusions, such as negative resists, that creates shadow regions.

The present invention should not be considered as being limited to the above described embodiments and the following experiments. It includes all possible variations covered by the scope defined by the appended claims. The encapsulation structure may be used in any situation where an scratch resistant oxygen and/or moisture barrier encapsulation is needed.

EXAMPLES

Example 1

Organic Planarisation Layer

A UV-lacquer, SU-8, commercially available from MicroChem Corp, was deposited on a polyLED device with negative resists by several different depositing methods that all worked good. A N—O—N—O—N sealing structure was already deposited on the device. The lacquer has a very low viscosity and therefore it fills the negative angles below the negative resists well. The lacquer was dried at temperatures around 95° C., and then the lacquer was exposed to UV-light (400 mJ at 365 nm) and thereby hardened. The stabilisation layer was transparent and gave a good planar surface on the device.

The different depositing methods used were: Spin Coating with photolithography defining the structure, spray coating with a shadow mask, screen printing, and inkjet printing. Different concentrations of the UV-lacquer was used depending on the different depositing methods.

Example 2

Inorganic Planarisation Layer

The following composition was mixed, refluxed for 2 hours and then cooled down to room temperature:

74 g 3-glycidooxypropyltrimethoxysilane 20 g methanol 1 g Aluminium di-s-butoxide ethylacetoacetate 17 g HCl (0.005 N)

After deposition of a N—O—N—O—N sealing structure on polyLED device with negative resists, the above described composition was deposited on the device by several different depositing methods. The composition was dried at 80° C. and further hardened at 120° C. The thickness of the stabilisation layer could be varied from 20 μm to at least 60 μm. The stabilisation layer was transparent and gave a good planar surface on the device.

The depositing method used was spray coating with a shadow mask. Other possible depositing methods are screen printing and inkjet printing.

Example 3

Inkjet Printing

The UV-lacquer SU-8 was diluted with γ-butyrolactone in order to obtain a proper viscosity for inkjet printing of the lacquer of about 10 cP. The experiments were performed with a single nozzle ink jet head. After deposition of a N—O—N—O—N sealing structure on polyLED device with negative resists a 15 μm thick stabilisation layer was deposited on the device by inkjet printing of the solution in the lines formed between two adjacent parallel negative resists. 150 pl drops were printed at a distance of 12 μm with a table speed of 15 mm/s. Every printed line merged with an adjacent printed line to form a ~50 μm thick continuous layer covering the negative resists. The lacquer was dried at temperatures around 55° C., and then the lacquer was exposed to UV-light (400 mJ at 365 nm) and thereby hardened to form a 15 μm thick stabilisation layer. This printing method is easily transferred to a multi nozzle inkjet system for quicker printing of larger areas.

To prevent the printed (not hardened) liquid from spreading outside the edges of the display device during this experiment, it was found favourable to arrange protruding barriers at the ends of the lines formed by the space between two parallel adjacent negative resists, which lines were used for the deposition of the lacquer. The barriers were arranged at each end of said lines, inbetween the ends of two parallel adjacent negative resists. The purpose of the protruding barriers were to close the opening between the ends of said parallel adjacent negative resists, to effectively stop the capillary transport of liquid lacquer from the display device. The use of such protruding barriers provided a minimal leakage of the printed liquid lacquer out from the display device, and resulted in a planar surface of the stabilisation layer, even at the edges of the display device.

The invention claimed is:

1. An encapsulation structure for a display device, comprising:
   a dielectric sealing structure that seals protruding structures, the dielectric sealing structure being non-planar and conforming to a shape of the protruding structures; and
   stabilization layer located over the dielectric sealing structure to form a substantially planar surface;
   wherein the protruding structures have negative slopes that form shadow regions.

2. The encapsulation structure according to claim 1, wherein said stabilization layer is of a polymeric material.

3. The encapsulation structure according to claim 1, wherein said sealing structure comprises a first layer of a first dielectric material and a second layer of a second dielectric material.

4. The encapsulation structure according to claim 3, wherein said sealing structure further comprises a third layer of a third dielectric material.

5. The encapsulation structure according to claim 4, wherein said third dielectric material is the same as said first dielectric material.

6. The encapsulation structure according to claim 3, wherein said first dielectric material is selected from the group comprising silicon nitride, aluminium nitride and any mixture thereof, and wherein said second dielectric material is selected from the group comprising silicon oxide, silicon oxide fluoride, titanium oxide, tantalum oxide, zirconium oxide, hafnium oxide, aluminium oxide and any mixture thereof.

7. The encapsulation structure according to claim 3, wherein said first dielectric material is selected from the group comprising silicon oxide, silicon oxide fluoride, titanium oxide, tantalum oxide, zirconium oxide, hafnium oxide, aluminium oxide and any mixture thereof, and wherein said second dielectric material is selected from the group comprising silicon nitride, aluminium nitride and any mixture thereof.

8. The encapsulation structure according to claim 1, wherein an essentially cavity-free interface is formed between said stabilization layer and said sealing structure.

9. The encapsulation structure according to claim 1, wherein the thermal expansion coefficient of said stabilization layer is essentially the same as the thermal expansion coefficient of said sealing structure.

10. The encapsulation structure according to claim 1, wherein the thickness of said stabilization layer is at least 0.1 μm.

11. The encapsulation structure according to claim 1, wherein said encapsulation structure is transparent.

12. The encapsulation structure according to claim 1, wherein said stabilization layer is of a non-polymeric material.

13. The encapsulation structure according to claim 12, wherein said non-polymeric material is a cured inorganic material.

14. The encapsulation structure according to claim 1, wherein said display device is selected from a polyLED display, an OLED display or a Liquid Crystal Display.

15. A display device comprising an encapsulation structure according to claim 1.

16. The encapsulation structure of claim 1, wherein the dielectric sealing structure comprises silicon oxide fluoride.

17. The encapsulation structure of claim 1, wherein the stabilization layer comprises Indium.

18. A method for manufacturing an encapsulation structure for a display device comprising the acts of:
   depositing a dielectric sealing structure that seals protruding structures, the dielectric sealing structure being non-planar and conforming to a shape of the protruding structures; and
   depositing a stabilization layer over the dielectric sealing structure to form a planar surface;
   wherein the protruding structures have negative slopes that form shadow regions.

19. The method according to claim 18, wherein said depositing of the stabilization layer comprises depositing a curable composition, and curing said curable composition.

20. The method according to claim 19, wherein said curing is thermal curing.

21. The method according to claim 18 wherein said stabilization layer is deposited by inkjet printing.

22. The method according to claim 18 wherein said display device is selected from a polyLED display, an OLED display and a LCD display.

23. A display device obtainable by the method according to claim 18.

24. The method of claim 18, further comprising the act of selecting materials for the dielectric sealing structure and stabilization layer such that the materials have substantially equal thermal expansion coefficients.

25. The method of claim 18, wherein the depositing the dielectric sealing structure is performed at 80° C.

* * * * *